United States Patent
Krivts (Krayvitz) et al.

(10) Patent No.: US 11,294,164 B2
(45) Date of Patent: Apr. 5, 2022

(54) INTEGRATED SYSTEM AND METHOD

(71) Applicant: APPLIED MATERIALS ISRAEL LTD., Rehovot (IL)

(72) Inventors: Igor Krivts (Krayvitz), Rehovot (IL); Yoram Uziel, Misgav (IL); Albert Mariasin, Rehovot (IL); Nir Merry, Mountain View, CA (US); Rami Elichai, Ashkelon (IL); Zvi Goren, Nes-Ziona (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 322 days.

(21) Appl. No.: 16/523,514

(22) Filed: Jul. 26, 2019

(65) Prior Publication Data
US 2021/0026123 A1 Jan. 28, 2021

(51) Int. Cl.
*G02B 21/00* (2006.01)
*G02B 21/26* (2006.01)

(52) U.S. Cl.
CPC ........... *G02B 21/26* (2013.01); *G02B 21/008* (2013.01)

(58) Field of Classification Search
CPC ............... G02B 21/26; G02B 21/008; H01J 2237/2811; H01J 37/226; H01J 2237/166; G01N 21/9501
See application file for complete search history.

(56) References Cited

U.S. PATENT DOCUMENTS

| | | | |
|---|---|---|---|
| 6,163,033 A * | 12/2000 | Smick | H01J 37/3171 |
| | | | 250/441.11 |
| 6,358,324 B1 | 3/2002 | Hongoh et al. | |
| 6,764,386 B2 | 7/2004 | Uziel et al. | |
| 6,899,765 B2 | 5/2005 | Krivts et al. | |
| 7,106,434 B1 | 9/2006 | Mapoles et al. | |
| 7,582,186 B2 | 9/2009 | Strang et al. | |
| 10,049,904 B1 * | 8/2018 | Adan | H01L 21/6719 |
| 10,177,048 B2 | 1/2019 | Frosien et al. | |
| 2004/0129226 A1 | 7/2004 | Strang et al. | |
| 2004/0232332 A1 | 11/2004 | Konno et al. | |
| 2005/0199807 A1 | 9/2005 | Watanabe et al. | |
| 2005/0200841 A1 | 9/2005 | Talbot et al. | |
| 2005/0236569 A1 | 10/2005 | Yamaguchi et al. | |
| 2007/0057184 A1 | 3/2007 | Uto et al. | |
| 2007/0200569 A1 | 8/2007 | Watanabe et al. | |
| 2009/0218509 A1 | 9/2009 | Ito et al. | |
| 2009/0309022 A1 | 12/2009 | Gunji et al. | |
| 2011/0194101 A1 | 8/2011 | Tachizaki et al. | |
| 2012/0001070 A1 | 1/2012 | Takagi et al. | |
| 2012/0074316 A1 | 3/2012 | Watanabe et al. | |
| 2012/0074319 A1 | 3/2012 | Nishiyama et al. | |
| 2012/0233542 A1 | 9/2012 | Funakoshi | |
| 2012/0274931 A1 | 11/2012 | Otani et al. | |
| 2013/0167665 A1 | 7/2013 | Niibori et al. | |
| 2013/0228685 A1 | 9/2013 | Obara et al. | |

(Continued)

OTHER PUBLICATIONS

Hafner, "Scanning electron microscopy primer", Characterization Facility, University of Minnesota—Twin Cities, 2007, pp. 1-29.

*Primary Examiner* — Mustak Choudhury
(74) *Attorney, Agent, or Firm* — Kilpatrick Townsend & Stockton LLP (57) ABSTRACT

A method and an integrated system. The integrated system can include an optical inspection unit, a charged particle device, an interface unit, and at least one controller.

18 Claims, 9 Drawing Sheets

(56) References Cited

U.S. PATENT DOCUMENTS

| | | |
|---|---|---|
| 2013/0284593 A1 | 10/2013 | Shichi et al. |
| 2013/0284924 A1 | 10/2013 | Mizuochi et al. |
| 2014/0014848 A1 | 1/2014 | Hatakeyama et al. |
| 2014/0091215 A1 | 4/2014 | Watanabe et al. |
| 2014/0204194 A1 | 7/2014 | Otani et al. |
| 2014/0239529 A1 | 8/2014 | Tan et al. |
| 2015/0083908 A1 | 3/2015 | Ominami et al. |
| 2015/0116712 A1 | 4/2015 | Otani et al. |
| 2015/0330912 A1 | 11/2015 | Gosain et al. |
| 2015/0377921 A1 | 12/2015 | Ukraintsev et al. |
| 2016/0047752 A1 | 2/2016 | Ahn et al. |
| 2016/0163570 A1 | 6/2016 | Rice et al. |
| 2016/0260642 A1 | 9/2016 | Frosien et al. |

\* cited by examiner

INTEGRATED SYSTEM AND METHOD

BACKGROUND OF THE INVENTION

Integrated circuits are manufactured by a highly complex manufacturing process. The integrated circuit may be evaluated during the manufacturing process and even after a completion of the manufacturing process. The evaluation of the integrated circuit may include inspecting the integrated circuit, reviewing the integrated circuit and/or measuring structural elements of the integrated circuit.

An optical inspection system is configured to receive a cassette that stores a group of semiconductor wafers, and to inspect the semiconductor wafers in a sequential manner. Assuming that there are four semiconductor wafers in a cassette, and that an inspection session is one hour long—each semiconductor wafer is not evaluated for at least three hours.

A scanning electron microscope is configured to receive the cassette that stores the group of semiconductor wafers, and to review the semiconductor wafers in a sequential manner. Assuming that there are four semiconductor wafers in a cassette, and that a review session is one hour long—each semiconductor wafer is not evaluated for at least three hours.

Prior art optical inspection tools and scanning electron microscopes typically include very large chambers. In order to evaluate a semiconductor wafer a typical chamber has to define an inner space that has a length and a width that are at least twice a diameter of the semiconductor wafer. These very large chambers force semiconductor manufacturers of semiconductor wafer to position the optical inspection tools and scanning electron microscopes at different locations.

There is a growing need to provide fast and compact systems and methods for evaluating objects such as integrated circuits.

BRIEF SUMMARY OF THE INVENTION

Some embodiments of the invention provide an integrated system that can include an optical inspection unit; a charged particle device that comprises a charged particle device chamber, a chuck, a movement system, a charged particle module, and a load lock; an interface unit that can be configured to receive groups of objects, to provide an object of the group to the charged particle device, and to provide another object of the group to the optical inspection unit; at least one controller that can be configured to control the optical inspection unit, the charged particle device and the interface unit. The charged particle device can be configured to evaluate the object and the optical inspection unit can be configured to inspect the other object in a partially overlapping manner. The charged particle device chamber has chamber housing that defines an inner space. The chuck can be configured to support the object while the object can be positioned within the inner space. The movement system can be configured to move the chuck; and wherein the charged particle module can be configured to irradiate the object with a charged particle beam and to detect particles emitted from the object. A length of the inner space can be smaller than twice a length of the object, and a width of the inner space can be smaller than twice a width of the object.

In some embodiments may be provided a method for evaluating objects by an integrated system, the method can include receiving, by an interface unit of the integrated system, groups of objects; providing, by the interface unit, an object of the group to a charged particle device; wherein the charged particle device can include a chuck, a movement system, a charged particle module, a load lock, and a charged particle device chamber that has an inner space; providing, by the interface unit, another object of the group to an optical inspection unit; evaluating, by the charged particle device, the object; wherein the evaluating can include (a) supporting the object by the chuck while the object can be positioned within the inner space, (b) moving the object by the movement system, (c) irradiating the object by charged particle module with a charged particle beam, and (d) detecting particles emitted from the object; inspecting, by the inspection unit, the other object. The evaluating and the inspecting at least partially overlap in time. A length of the inner space can be smaller than twice a length of the object, and a width of the inner space can be smaller than twice a width of the object.

BRIEF DESCRIPTION OF THE DRAWINGS

The subject matter regarded as the invention is particularly pointed out and distinctly claimed in the concluding portion of the specification. The invention, however, both as to organization and method of step, together with substrates, features, and advantages thereof, may best be understood by reference to the following detailed description when read with the accompanying drawings in which:

It will be appreciated that for simplicity and clarity of illustration, elements shown in the Figures have not necessarily been drawn to scale. For example, the dimensions of some of the elements may be exaggerated relative to other elements for clarity. Further, where considered appropriate, reference numerals may be repeated among the Figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Any reference in the specification to a method should be applied mutatis mutandis to a system capable of executing the method. Any reference in the specification to a system should be applied mutatis mutandis to a method that may be executed by the system. The assignment of the same reference numbers to various components may indicate that these components are similar to each other.

The following examples sometimes refer to an object. The object may be a semiconductor wafer, a lithographic mask, and the like.

Figure 1:
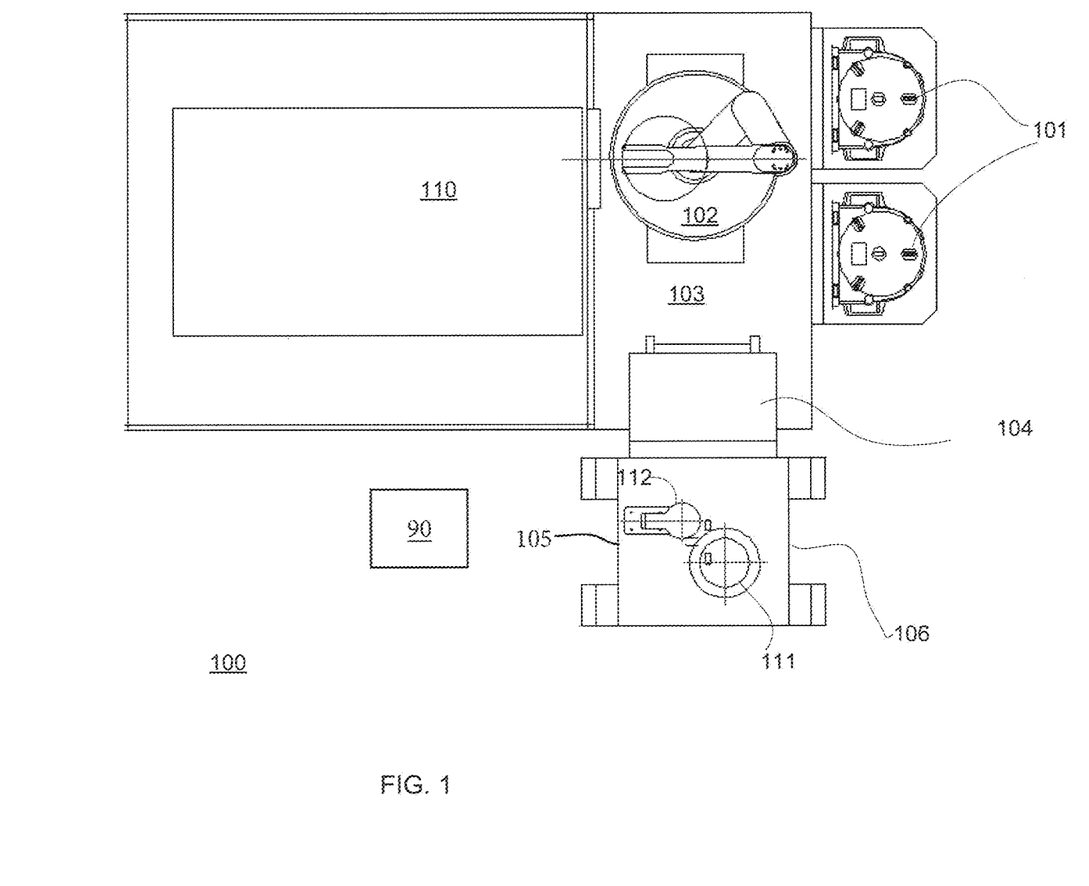
FIG. 1 is an example of a top view of an integrated tool.

FIG. 1 illustrates an example of an integrated system 100 that includes optical inspection unit 110, charged particle device 105, at least one controller 90, and interface unit 103 that has load ports for supporting wafer cassettes 101. The at least one controller 90 can be configured to control the optical inspection unit 110, charged particle device 105, and the interface unit 103.

FIG. 1 illustrates load ports for supporting two cassettes, but the load ports may support only a single cassette or more than two cassettes at the same time. Interface unit 103 can be a factory interface unit. The interface unit 103 can include a distribution system such as an outside transfer robot 102, which is located into interface unit 103, and is configured to transfers one or more objects from one or more cassettes to the optical inspection unit 110 and/or to the charged particle device 105.

The interface unit 103 can transfer an object between the optical inspection unit 110 and the charged particle device 105. The interface unit 103 can provide an object to the charged particle device 105 and another object to the optical inspection unit 110, thereby allowing a parallel or at least partially overlapping operation of the optical inspection unit 110 and the charged particle device 105. For example, the charged particle device 105 can review an object while the optical inspection unit 110 can inspect another object.

The time required for transferring an object to the charged particle device 105 is substantially shorter than the review period of the object by the charged particle device 105. The time required for transferring an object to the optical inspection unit 110 is substantially shorter than the inspection period of the object by the optical inspection unit 110. Accordingly, the interface unit 103 can provide an object to the optical inspection unit 110, then provide another object to the charged particle device 105- and the charged particle device 105 can start reviewing the other object before a significant part of the inspection process was completed.

Assuming that there are four objects in a cassette, the inspection session is one hour long and the review session is one hour long—the integrated system can review and inspect the four wafers is about five hours—instead of eight hours.

The charged particle device 105 is very compact and thus can be easily integrated with the larger optical inspection unit 110.

In FIG. 1 the charged particle device 105 is shown as including charged particle device chamber 106, optical microscope 112 and scanning electron microscope column 111. Scanning electron microscope column 111 and optical microscope 112 are installed on a cover of the charged particle device vacuum chamber 106.

Figure 2:
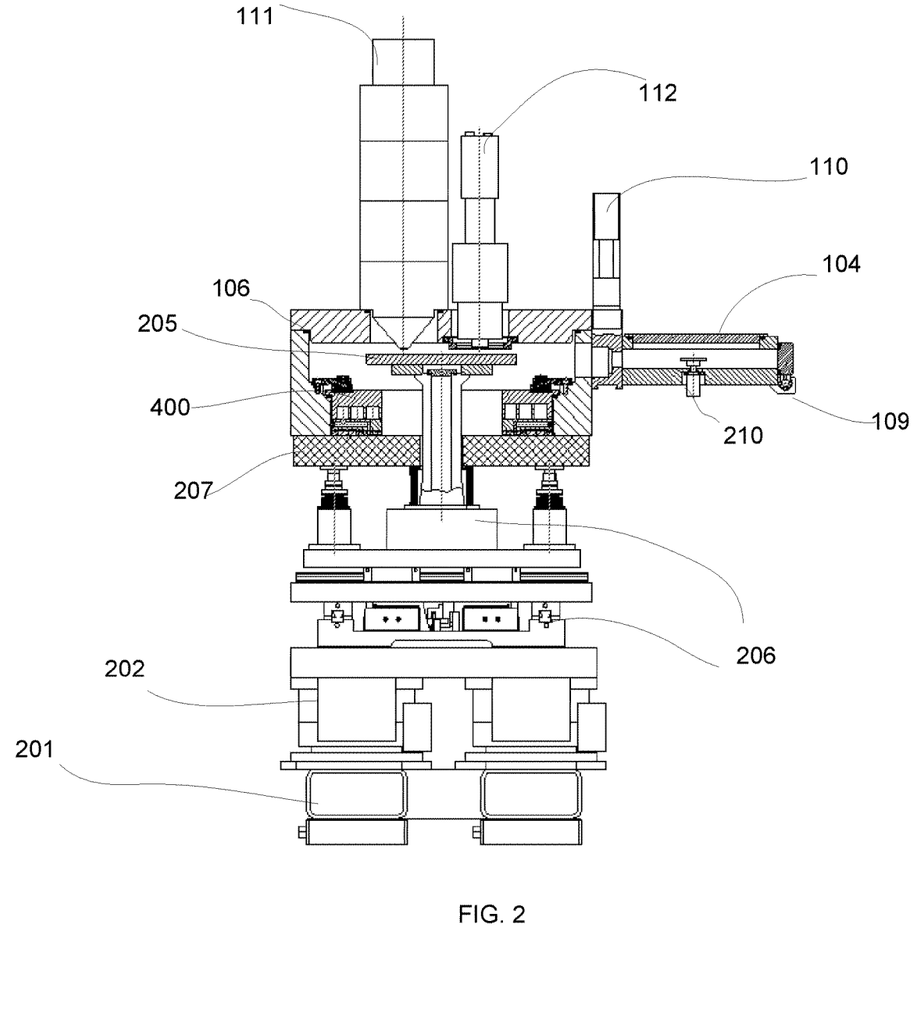
FIG. 2 is an example of a cross sectional view of a vacuum chamber with scanning electron microscope.

FIG. 2 illustrates a cross section view of a charged particle device 105 that includes:
a. Scanning electron microscope column 111.
b. Optical microscope 112.
c. Charged particle device vacuum chamber 106.
d. Chassis 201.
e. Load lock 104.
f. External gate 109.
g. Internal gate 117.
h. Pre-liner 210.
i. Vibration isolation system 202, which is installed on the chassis 201. The vibration isolation system 202 can also support the optical inspection unit 110. Such configuration allows reaching a high-resolution image of the object features and improves the quality of treatment in process chambers 106.
j. Chuck 205. Chuck 205 can be an electrostatic chuck or a mechanical chuck. Chuck 205 can support an object.
k. Movement system 206.
l. An intermediate element such as sealing plate 207.
m. AB/DP module 400. AB/DP stands for air bearing/differential pumping.
n. Inner space 411 that is defined by the housing of the charged particle device chamber 106 and the sealing plate 207.

An outside transfer robot 102, which is located into interface unit 103, transfers the objects from wafer cassette 101 to load lock 104. One or more vacuum pumps (not shown) connected to the load lock 104 can pump down the load lock 104 to a desired pressure level that may approximate the pressure level in charged particle device chamber 106. An external gate 109 and internal gate 117 of the load lock 104 with vacuum pumps and venting system (not shown) provide necessary vent/pump cycle of the load lock 104.

Figure 3:
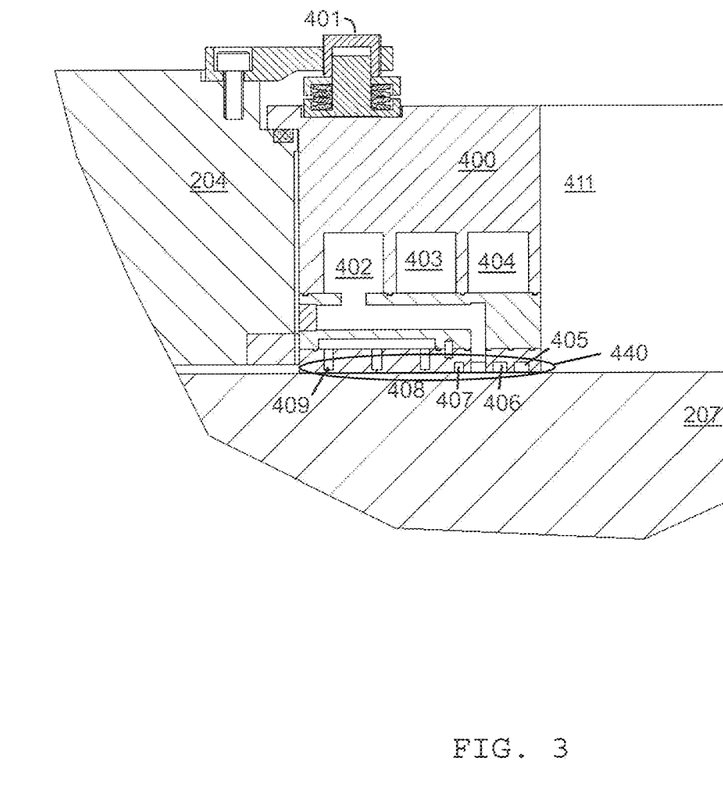
FIG. 3 is an example of a cross sectional view of some evaluation chamber elements that illustrates a dynamic seal.

Chuck 205 is configured to support the object while the object is positioned within the inner space 411 (see FIG. 3). Movement system 206 is configured to move the chuck 205.

Charged particle device 105 has a charged particle module that can include scanning electron microscope column 111 and one or more sensors. The one or more sensors can be positioned within the scanning electron microscope column 111 and/or outside the scanning electron microscope column 111. Charged particle device 105 is configured to irradiate the object with a charged particle beam and to detect particles emitted from the object.

The length of inner space 411 is smaller than twice a length of the object, and a width of the inner space is smaller than twice a width of the object. Especially length of the inner space is smaller than twice the length of the object and exceeds 1.5 times of the length of the object. The width of the inner space is smaller than twice the width of the object and exceeds 1.5 times of the width of the object.

The movement system 206 can include a rotation stage (also referred to as theta stage) for rotating the object, a Z stage and can also include one stage such as an XY stage or a R stage.

The object, during the review process, is located in the inner space 411 in which predetermined conditions (contamination level, vacuum level, temperature and the like) are maintained even when the object is moved by the movement system 206.

The movement system 206 can be located in atmosphere environment. Cables, control device and various other components can be located in atmosphere in order to reduce and even eliminate the amount of contaminating elements generated within the atmosphere. The chamber can be free of moving parts.

Figure 4:
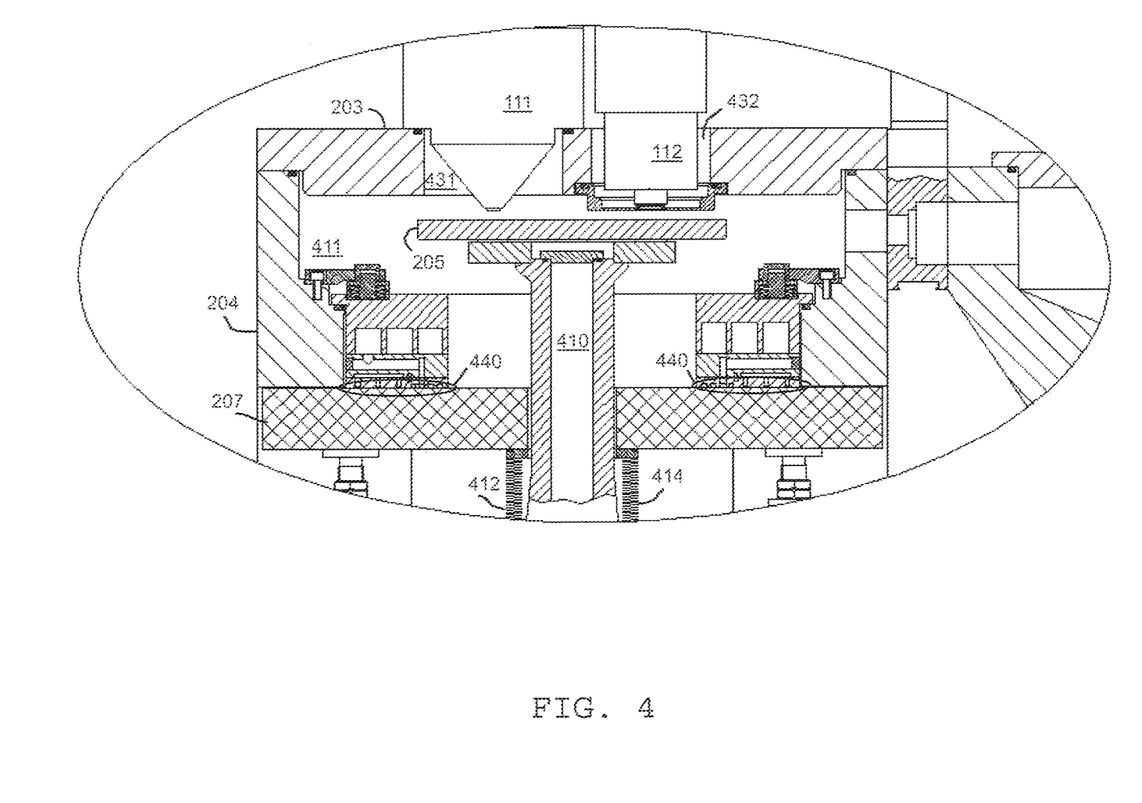
FIG. 4 is an example of a cross sectional view of some evaluation chamber elements.

The inner space 411 is a vacuumed space that can be isolated from atmosphere environment by using one or more dynamic seals—such as dynamic seals 440 of FIGS. 3 and 4.

Contamination which is generated by the movement system 206, by bearing and from plastic cables can be prevented from reaching the inner space 411 due to a positive air flow formed by the dynamic seal. The dynamic seal can be arranged to generate an air flow directed towards the atmosphere and thus repel contamination from entering the vacuum chamber.

FIG. 3 is a cross sectional view of the area of AB/DP module 400 that illustrates a dynamic seal 440. The seal is dynamic in the sense that it requires to circulate air.

AB/DP module 400 is mechanically connected to sidewall 204 and forms a dynamic seal 440 between the bottom surface of the AB/DP module 400 and sealing plate 207. The AB/DP module 400 can include one or more sealing elements such as first vacuum conduit 402, second vacuum conduit 403 and third vacuum conduit 404, each of which is connected with its vacuum pump (not shown in figure).

The bottom surface of AB/DP module 400 includes the three vacuum grooves 405, 406 and 407 and atmospheric pressure gas groove 408 which is a differential pumping unit. In addition, the bottom part of AB/DP module 400 can include several orifices 409 which form an air bearing unit. The manner in which a gas cushion (dynamic seal) is formed is illustrated, for example, in U.S. Pat. No. 6,899,765 which is incorporated herein by reference. Different conduits can provide gas at different pressure and/or vacuum levels.

AB/DP module 400 can be mechanically connected to sidewall 204 by a clamping mechanism 401. The clamping mechanism 401 is arranged around the perimeter of AB/DP module 400 and are adapted to provide sufficient force to compensate for the force of the pressure differential between the AB/DP module 400 and the atmosphere.

Figure 5:
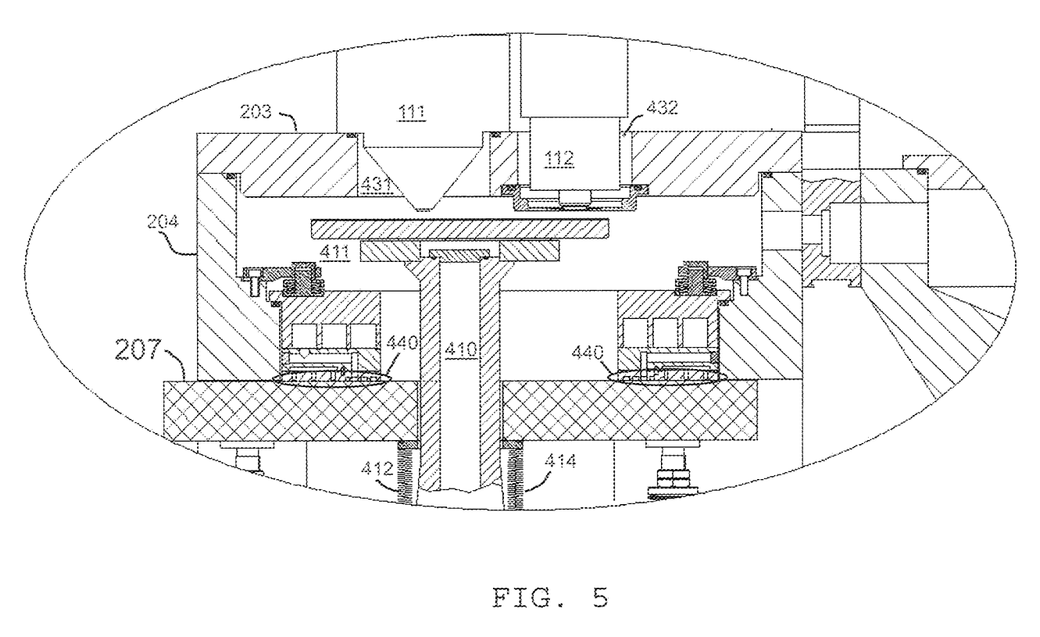
FIG. 5 is an example of a cross sectional view of some evaluation chamber elements.

FIGS. 4 and 5 illustrate various parts of the integrated system 100 such as cover 203 (of charged particle device chamber 106), scanning electron microscope column 111, optical microscope 112, chuck 205, support element 410, sealing plate 207, first opening 431, second opening 432, first bellows 412 and second bellows 414. Support element 410 supports chuck 205 and mechanically coupled chuck 205 to the movement system 206. FIGS. 4 and 5 also illustrate dynamic seals 440.

First bellows 412 and second bellows 414 surround the support element 410 in order to prevent a leakage of particles from the movement system 206 into inner space 411. First opening 431 and second opening 432 are formed in cover 203. A lower part of scanning electron microscope column 111 is inserted through first opening 431. A lower part of optical microscope 112 is inserted through second opening 432.

The sealing plate 207 of FIG. 5 is positioned in a different position than the sealing plate 207 of FIG. 4—due to a movement of the sealing plate 207 (as well as the support element 410 and the chuck 205) by the movement system.

Figure 6:
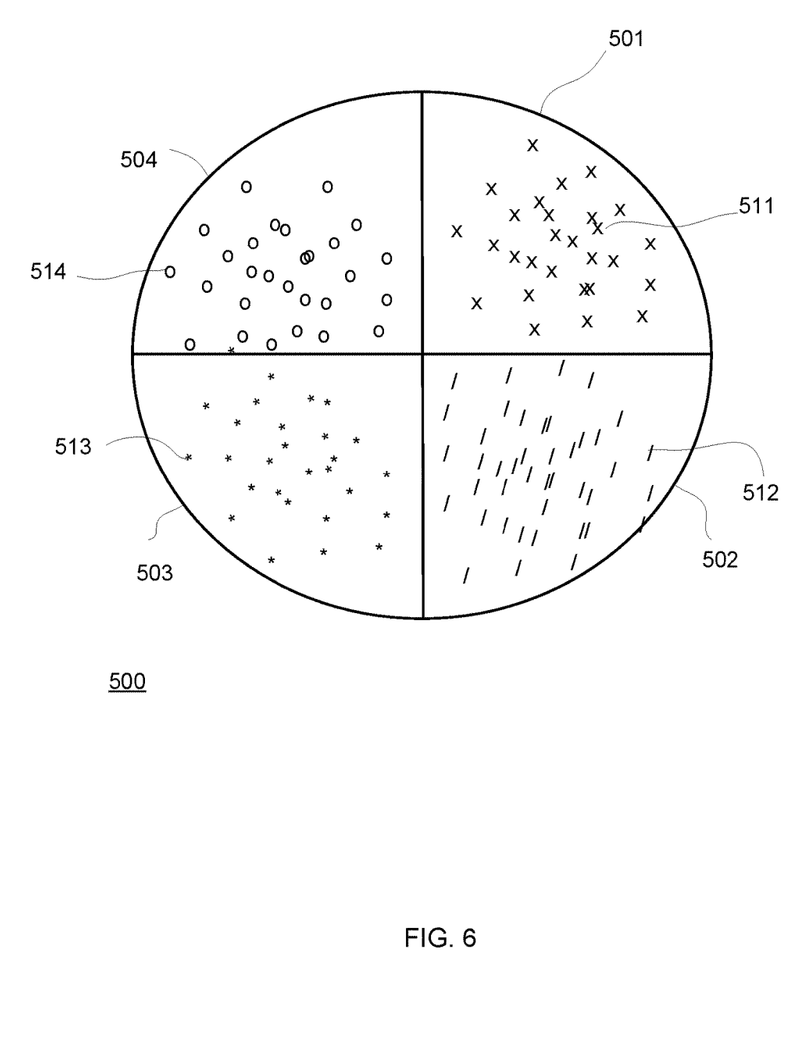
FIG. 6 is an example of an object.

FIG. 6 illustrates an example of object 500, first region 501, second region 502, third region 503, fourth region 504, portions 511 of first region 501, portions 512 of second region 502, portions 513 of third region 503 and portions 514 of fourth region 504.

Object 500 has a symmetrical symmetry and first region 501, second region 502, third region 503, fourth region 504 have a quadrant shape. The charged particle device 105 can evaluate object 500 by four iterations. A single region can be evaluated during each iteration of the four iterations. Each iteration can start by rotating the object 500 by ninety degrees in order to reach the region that should be evaluated during the iteration.

Reaching regions means that portions of the region can be positioned within the field of view of the scanning electron microscope and the field of view of the optical microscope by moving the chuck.

The movement of the chuck are limited to movement that do should not cause another region of the object to be positioned within the field of view of the scanning electron microscope and/or within the field of view of the optical microscope.

During a first iteration, portions 511 of first region 501 can be positioned within the within the field of view of the scanning electron microscope and/or within the field of view of the optical microscope.

During a second iteration, portions 512 of second region 502 can be positioned within the within the field of view of the scanning electron microscope and/or within the field of view of the optical microscope.

During a third iteration, portions 513 of third region 503 can be positioned within the within the field of view of the scanning electron microscope and/or within the field of view of the optical microscope.

During a fourth iteration, portions 514 of fourth region 504 can be positioned within the within the field of view of the scanning electron microscope and/or within the field of view of the optical microscope.

Figure 7:
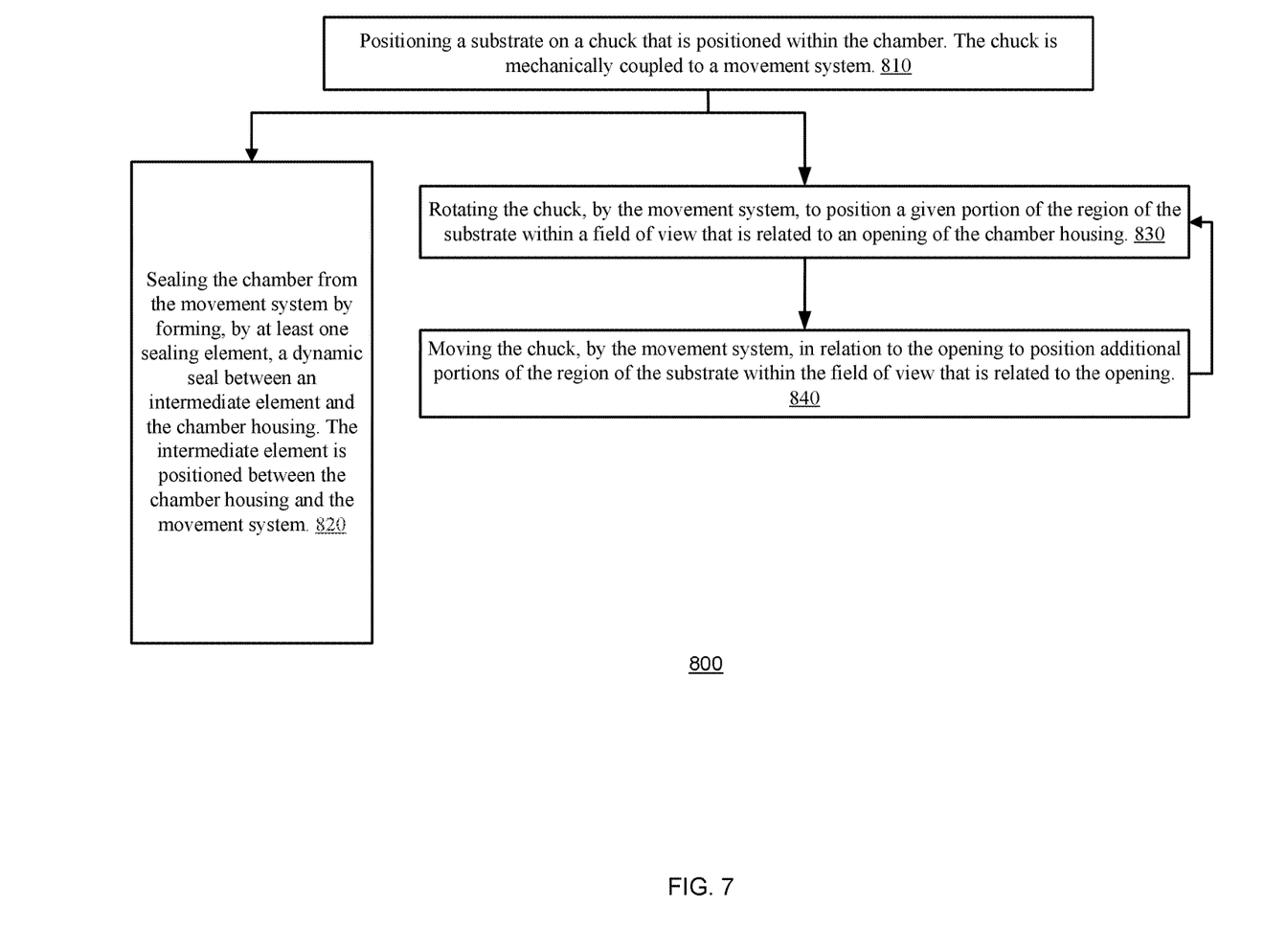
FIG. 7 is an example of a method.

FIG. 7 is an example of method 800 for moving an object within a chamber that includes a chamber housing. Method 800 can start by step 810 of positioning an object on a chuck that is positioned within the chamber. The chuck is mechanically coupled to a movement system.

Step 810 can be followed by step 820 of sealing the chamber from the movement system by forming, by at least one sealing element, a dynamic seal between an intermediate element and the chamber housing. The intermediate element is positioned between the chamber housing and the movement system.

Step 810 can also be followed by repeating, for each region of the object out of a plurality of regions of the object, steps 830 and 840.

Step 830 can include rotating the chuck, by the movement system, to position a given portion of the region of the object within a field of view that is related to an opening of the chamber housing. The field of view is related to the opening in the sense that (a) an evaluation tool that has a field of view can be partially inserted through the opening, and/or (b) an evaluation tool that has a field of view can view the object through the opening.

Step 830 can include using a rotary stage of the movement system to rotate the chuck. Step 830 can be followed by step 840 of moving the chuck, by the movement system, in relation to the opening to position additional portions of the region of the object within the field of view that is related to the opening.

Step 830 and 840 can be executed in parallel to step 820. The object can have a radial symmetry and the plurality of regions can include four regions—or any other number of regions.

Step 840 can include at least one of the following:
a. Using an XY (X-axis and Y-axis) stage of the movement system.
b. Moving the intermediate element in relation to the chamber housing while moving the chuck in relation to the opening.
c. Moving the intermediate element by up to a maximal distance in any direction, wherein the maximal distance does not exceed one hundred and twenty percent of a radius of the object.

Figure 9:
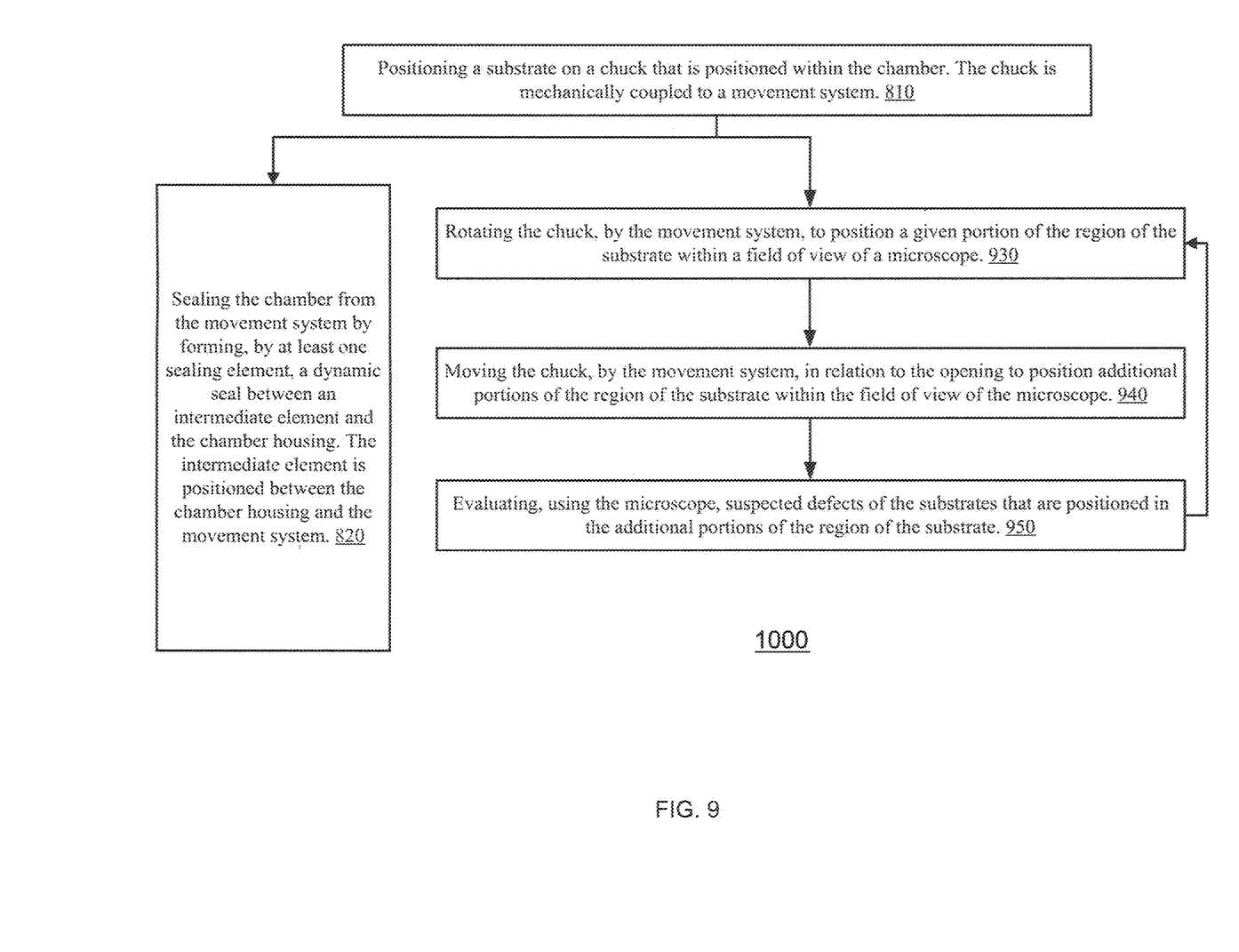
FIG. 9 is an example of a method.

FIG. 9 is an example of method 900 for moving an object within a chamber that includes a chamber housing. Method 900 can start by step 810 of positioning an object on a chuck that is positioned within the chamber. The chuck is mechanically coupled to a movement system.

Step 810 can be followed by step 820 of sealing the chamber from the movement system by forming, by at least one sealing element, a dynamic seal between an intermediate element and the chamber housing. The intermediate element is positioned between the chamber housing and the movement system.

Step 810 can also be followed by repeating, for each region of the object out of a plurality of regions of the object, steps 930, 940 and 950.

Step 930 can include rotating the chuck, by the movement system, to position a given portion of the region of the object within a field of view of a microscope.

Step 930 can be followed by step 940 of moving the chuck, by the movement system, in relation to the opening to position additional portions of the region of the object within the field of view of the microscope.

Step 940 can be followed by step 950 of evaluating, using the microscope, suspected defects of the objects that are positioned in the additional portions of the region of the object. The microscope can be a scanning electron microscope.

Step 950 can include finding the suspected defects using an optical microscope and scanning the suspected defects by the scanning electron microscope.

The chamber can be used as a review chamber—in which a review tool such as a scanning electron microscope reviews defects of an object positioned within the chamber. The review chamber can be included in an optical inspection system.

The scanning electron microscope can be configured to perform at least one of the following tasks: detect defect, review defects, measure dimensions, measure layer to layer location, measure pattern positioning and edge placement accuracy.

Figure 8:
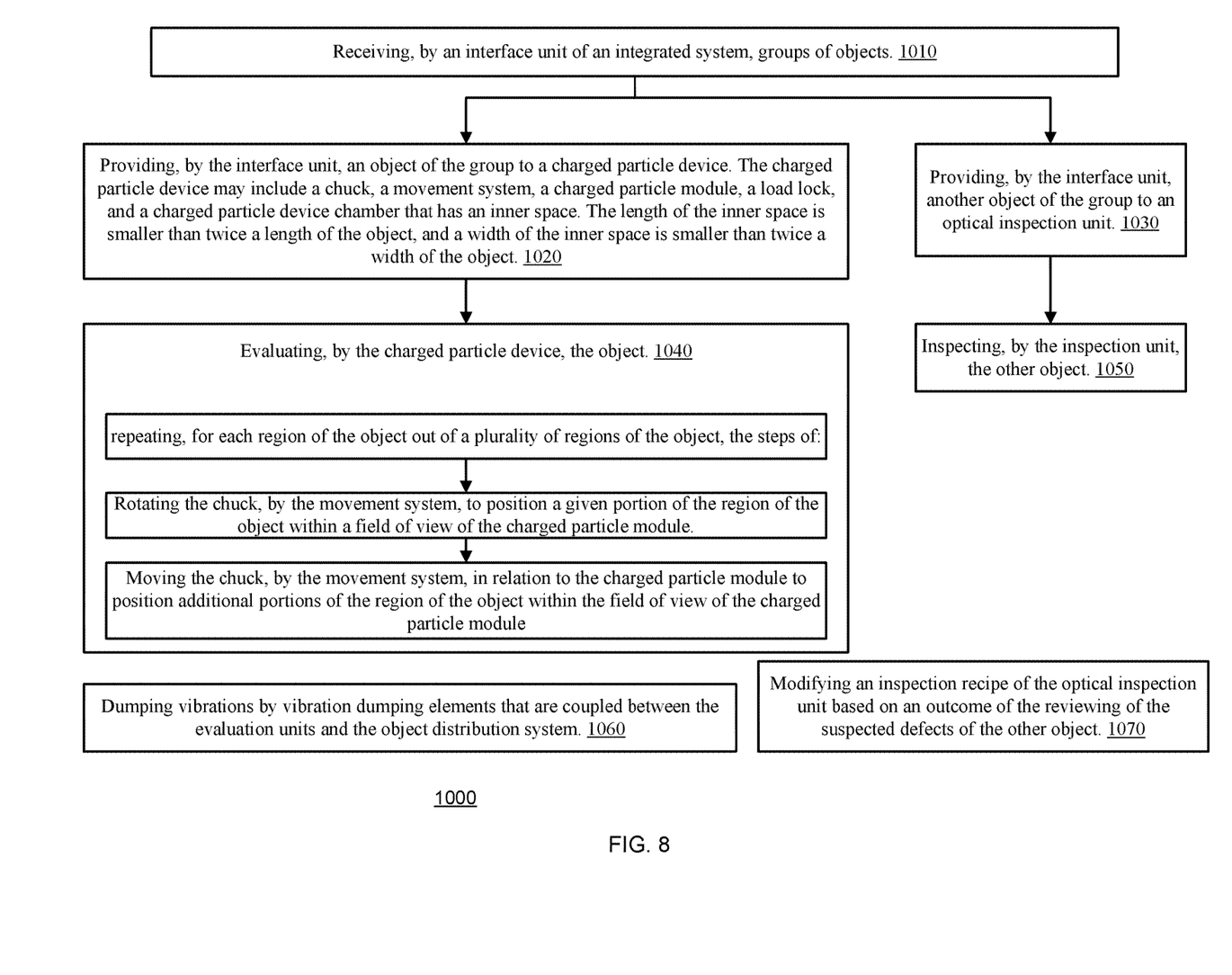
FIG. 8 is an example of a method.

FIG. 8 is an example of method 1000. Method 1000 can start by step 1010 of receiving, by an interface unit of an integrated system, groups of objects. Step 1010 can be followed by steps 1020 and 1030.

Step 1020 can include providing, by the interface unit, an object of the group to a charged particle device. The charged particle device can include a chuck, a movement system, a charged particle module, a load lock, and a charged particle device chamber that has an inner space. The length of the inner space is smaller than twice a length of the object, and a width of the inner space is smaller than twice a width of the object.

Step 1030 can include providing, by the interface unit, another object of the group to an optical inspection unit.

Step 1020 can be followed by step 1040 of evaluating, by the charged particle device, the object. Step 1040 can include (a) supporting the object by the chuck while the object is positioned within the inner space, (b) moving the object by the movement system, (c) irradiating the object by charged particle module with a charged particle beam, and (d) detecting particles emitted from the object.

Step 1030 can be followed by step 1050 of inspecting, by the inspection unit, the other object. Steps 1040 and 1050 can at least partially overlap in time. Accordingly—there is at least an overlap period of time during which steps 1040 and 1050 are concurrently executed.

The charged particle device can be a scanning electron microscope. The length of the inner space can be smaller than twice the length of the object and exceeds 1.5 times of the length of the object. The width of the inner space can be smaller than twice the width of the object and exceeds 1.5 times of the width of the object.

Step 1040 can include repeating, for each region of the object out of a plurality of regions of the object, the steps of: (i) rotating the chuck, by the movement system, to position a given portion of the region of the object within a field of view of the charged particle module; and (ii) moving the chuck, by the movement system, in relation to the charged particle module to position additional portions of the region of the object within the field of view of the charged particle module.

The object can have a radial symmetry and the plurality of regions can include four regions.

Method 1000 can also include step 1060 of dumping vibrations by vibration dumping elements that are coupled between the evaluation units and the object distribution system. The dumping occurs at least during the execution of steps 1040 and 1060. The vibration dumping elements can be bellows.

Steps 1010, 1020, 1030, 1040 and 1060 can be repeated multiple times. The multiple repetitions may amount to:
 a. providing, by the interface unit, the other object to the charged particle device; and
 b. reviewing, by the charged particle device, suspected defects of the other object; wherein the suspected detects were found by the optical inspection unit.

Method 1000 can also include step 1070 of modifying an inspection recipe of the optical inspection unit based on an outcome of the reviewing of the suspected defects of the other object.

In the foregoing specification, the invention has been described with reference to specific examples of embodiments of the invention. It will, however, be evident that various modifications and changes can be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of step in other orientations than those illustrated or otherwise described herein.

The connections as discussed herein can be any type of connection suitable to transfer signals from or to the respective nodes, units or devices, for example via intermediate devices. Accordingly, unless implied or stated otherwise, the connections can for example be direct connections or indirect connections. The connections can be illustrated or described in reference to being a single connection, a plurality of connections, unidirectional connections, or bidirectional connections. However, different embodiments can vary the implementation of the connections. For example, separate unidirectional connections can be used rather than bidirectional connections and vice versa. Also, plurality of connections can be replaced with a single connection that transfers multiple signals serially or in a time multiplexed manner. Likewise, single connections carrying multiple signals can be separated out into various different connections carrying subsets of these signals. Therefore, many options exist for transferring signals.

Although specific conductivity types or polarity of potentials have been described in the examples, it will be appreciated that conductivity types and polarities of potentials can be reversed.

Those skilled in the art will recognize that the boundaries between logic blocks are merely illustrative and that alternative embodiments can merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described steps are merely illustrative. The multiple can be combined into a single step, a single step can be distributed in additional steps and steps can be executed at least partially overlapping in time. Moreover, alternative embodiments can include multiple instances of a particular step, and the order of steps can be altered in various other embodiments.

Also for example, in one embodiment, the illustrated examples can be implemented as circuitry located on a single integrated circuit or within a same device. Alternatively, the examples can be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. An integrated system comprising: a charged particle device configured to evaluate an object, the charged particle device comprising a charged particle device chamber having a chamber housing that defines an inner space, a chuck configured to support the object while the object is positioned within the inner space, a movement system configured to move the chuck, a charged particle module configured to evaluate the object by irradiating the object with a charged particle beam and detecting particles emitted from the object, and a load lock, wherein a length of the inner space is smaller than twice a length of the object, and a width of the inner space is smaller than twice a width of the object;
   an optical inspection unit;
   an interface unit having at least one load port for supporting a cassette and a robot configured to: receive a plurality of objects in the cassette, provide a first object of the plurality of objects to the charged particle device through the load lock, and provide a second object of the plurality of objects to the optical inspection unit while the first object is positioned within the charged particle device; and
   at least one controller that is configured to control the optical inspection unit, the charged particle device and the interface unit such that the optical inspection unit inspects the second object while the charged particle device evaluates the first object.

2. The integrated system according to claim 1 wherein the charged particle device is a scanning electron microscope.

3. The integrated system according to claim 1 wherein the length of the inner space is smaller than twice the length of the object and exceeds 1.5 times of the length of the object; and the width of the inner space is smaller than twice the width of the object and exceeds 1.5 times of the width of the object.

4. The integrated system according to claim 1 wherein the charged particle device comprises:
   an intermediate element that is positioned between the chamber housing and the movement system;
   at least one sealing element that is configured to form a dynamic seal between the intermediate element and the chamber housing, wherein the dynamic seal is configured to seal the inner space from the movement system; and
   wherein the movement system is configured to perform, for each region of the object out of a plurality of regions of the object, (a) a rotation of the chuck to position a given portion of the region of the object within a field of view of the charged particle module; and (b) a movement of the chuck in relation to the charged particle module to position additional portions of the region of the object within the field of view of the charged particle module.

5. The integrated system according to claim 1 further comprising a vibration isolation system coupled between the charged particle device and the interface unit.

6. The integrated system according to claim 5 wherein the vibration isolation system comprises bellows.

7. The integrated system according to claim 1 further comprising load ports that are parallel to the charged particle device.

8. The integrated system according to claim 1 wherein the object is a semiconductor wafer.

9. The integrated system according to claim 1 wherein the object is a lithographic mask.

10. A method for evaluating objects by an integrated system, the method comprising:
    receiving, by an interface unit of the integrated system, a plurality of objects;
    providing, by the interface unit, a first object of the plurality of objects to a charged particle device;
    wherein the charged particle device comprises a chuck, a movement system, a charged particle module, a load lock, and a charged particle device chamber that has an inner space;

providing, by the interface unit, a second object of the plurality of objects to an optical inspection unit;

evaluating, by the charged particle device, the first object; wherein the evaluating comprises (a) supporting the first object by the chuck while the first object is positioned within the inner space, (b) moving the first object by the movement system, (c) irradiating the first object by charged particle module with a charged particle beam, and (d) detecting particles emitted from the first object;

inspecting, by the inspection unit, the second object;

wherein the evaluating and the inspecting at least partially overlap in time; and wherein a length of the inner space is smaller than twice a length of the first object, and a width of the inner space is smaller than twice a width of the first object.

11. The method according to claim 10 wherein the charged particle device is a scanning electron microscope.

12. The method according to claim 10 wherein the length of the inner space is smaller than twice the length of the object and exceeds 1.5 times of the length of the object, and the width of the inner space is smaller than twice the width of the object and exceeds 1.5 times of the width of the object.

13. The method according to claim 10 further comprising repeating, for each region of the object out of a plurality of regions of the object, the steps of:

rotating the chuck, by the movement system, to position a given portion of the region of the object within a field of view of the charged particle module; and moving the chuck, by the movement system, in relation to the charged particle module to position additional portions of the region of the object within the field of view of the charged particle module.

14. The method according to claim 13 wherein the object has a radial symmetry and wherein the plurality of regions comprise four regions.

15. The method according to claim 10 further comprising dumping vibrations by a vibration isolation system coupled between the particle device and the interface unit.

16. The method according to claim 15 wherein the vibration isolation system comprises bellows.

17. The method according to claim 10 further comprising providing, by the interface unit, the second object to the charged particle device; and reviewing, by the charged particle device, suspected defects of the second object; wherein the suspected detects were found by the optical inspection unit.

18. The method according to claim 17 further comprising modifying an inspection recipe of the optical inspection unit based on an outcome of the reviewing of the suspected defects of the second object.

* * * * *